(12) United States Patent
Saito et al.

(10) Patent No.: US 10,312,852 B2
(45) Date of Patent: Jun. 4, 2019

(54) MOUNTING STRUCTURE FOR CONCENTRATED PHOTOVOLTAIC MODULE HOUSING, CONCENTRATED PHOTOVOLTAIC MODULE, CONCENTRATED PHOTOVOLTAIC PANEL, AND CONCENTRATED PHOTOVOLTAIC DEVICE

(71) Applicant: Sumitomo Electric Industries, Ltd., Osaka-shi (JP)

(72) Inventors: Kenji Saito, Osaka (JP); Akihiko Kojima, Osaka (JP); Koji Mori, Osaka (JP); Tomohiro Nemoto, Osaka (JP); Youichi Nagai, Osaka (JP)

(73) Assignee: SUMITOMO ELECTRIC INDUSTRIES, LTD., Osaka-Shi (JP)

( * ) Notice: Subject to any disclaimer, the term of this patent is extended or adjusted under 35 U.S.C. 154(b) by 0 days.

(21) Appl. No.: 15/742,277

(22) PCT Filed: Jun. 14, 2016

(86) PCT No.: PCT/JP2016/067610
§ 371 (c)(1),
(2) Date: Jan. 5, 2018

(87) PCT Pub. No.: WO2017/006712
PCT Pub. Date: Jan. 12, 2017

(65) Prior Publication Data
US 2018/0234046 A1    Aug. 16, 2018

(30) Foreign Application Priority Data
Jul. 9, 2015    (JP) ................................ 2015-137406

(51) Int. Cl.
*H02S 20/10* (2014.01)
*H02S 30/10* (2014.01)
(Continued)

(52) U.S. Cl.
CPC .............. *H02S 20/10* (2014.12); *H02S 20/30* (2014.12); *H02S 20/32* (2014.12); *H02S 30/10* (2014.12);
(Continued)

(58) Field of Classification Search
CPC .......... H02S 40/20; H02S 40/22; H02S 30/10; H01L 31/054; H01L 31/0543
See application file for complete search history.

(56) References Cited

U.S. PATENT DOCUMENTS

2011/0030764 A1*   2/2011   Seo ........................ H01L 31/052
                                                                        136/246
2011/0067747 A1*   3/2011   Chen ..................... H01L 31/052
                                                                        136/246
(Continued)

FOREIGN PATENT DOCUMENTS

JP    2011-196067 A    10/2011
JP    2013-012605 A    1/2013
JP    2013-084670 A    5/2013

*Primary Examiner* — Devina Pillay
*Assistant Examiner* — Daniel P Malley, Jr.
(74) *Attorney, Agent, or Firm* — Baker Botts LLP; Michael A. Sartori

(57) ABSTRACT

A mounting structure of a housing 11 for a concentrator photovoltaic module 1M includes: a bottom plate 15 framed from an electric conductor and having a plurality of cells 12c arrayed thereat; a side wall frame 16 made of resin, the side wall frame 16 standing along the outer edge of the bottom plate 15 and configured to hold a concentrating portion 13 so as to face the bottom plate 15; a pair of the frames 8 (support member) each being a grounded electric conductor, the pair of the frames 8 configured to be in contact with the bottom plate 15 to support the module 1M; and bolts 25 and nuts 26, as a fastening member, configured to fasten the pair of the frames 8 and the bottom plate 15 to each other thereby to fix the module 1M to the pair of the frames 8, the bolts 25 and (Continued)

the nuts 26 each being an electric conductor thereby to serve as paths for electric connection from the bottom plate 15 to the pair of the frames 8.

7 Claims, 9 Drawing Sheets

(51) Int. Cl.
  *H02S 20/32* (2014.01)
  *H02S 20/30* (2014.01)
  *H02S 40/22* (2014.01)
  *H01L 31/054* (2014.01)

(52) U.S. Cl.
  CPC ............ *H02S 40/22* (2014.12); *H01L 31/054* (2014.12); *Y02E 10/52* (2013.01)

(56) References Cited

U.S. PATENT DOCUMENTS

| | | | |
|---|---|---|---|
| 2012/0152309 A1* | 6/2012 | Miller | H01L 31/0543 136/246 |
| 2014/0230883 A1 | 8/2014 | Iwasaki et al. | |
| 2014/0251413 A1 | 9/2014 | Parras Padilla et al. | |
| 2017/0194902 A1* | 7/2017 | Meine | H02S 40/36 |

\* cited by examiner

MOUNTING STRUCTURE FOR CONCENTRATED PHOTOVOLTAIC MODULE HOUSING, CONCENTRATED PHOTOVOLTAIC MODULE, CONCENTRATED PHOTOVOLTAIC PANEL, AND CONCENTRATED PHOTOVOLTAIC DEVICE

TECHNICAL FIELD

The present invention relates to a mounting structure for a concentrator photovoltaic module housing, a concentrator photovoltaic module, a concentrator photovoltaic panel, and a concentrator photovoltaic apparatus.

BACKGROUND ART

Some concentrator photovoltaic apparatuses have a basic unit in which: small compound semiconductor elements each having a high power generation efficiency are used as power generating elements; and sunlight concentrated through Fresnel lenses are caused to be incident on the power generating elements.

A concentrator photovoltaic module is obtained by arranging a large number of such basic units in a matrix shape in one housing. A concentrator photovoltaic panel is obtained by further arranging a plurality of the modules.

As a housing to be used in the above-mentioned concentrator photovoltaic module, there is a housing that includes: a bottom plate where a plurality of power generating elements are arrayed; and a frame body standing along the outer edge of the bottom plate and holding a concentrating member such that the concentrating member faces the bottom plate.

In such a housing, in some cases, the frame body (excluding the bottom plate) is formed from resin in order to reduce the weight and the cost (for example, see PATENT LITERATURE 1).

CITATION LIST

Patent Literature

PATENT LITERATURE 1: Japanese Laid-Open Patent Publication No. 2013-84670

SUMMARY OF INVENTION

Technical Problem

A mounting structure for a concentrator photovoltaic module housing according to one embodiment is a mounting structure for a concentrator photovoltaic module housing configured to be used in a concentrator photovoltaic module, the concentrator photovoltaic module including: a plurality of power generating elements; and a concentrating member configured to concentrate sunlight toward each of the plurality of power generating elements, the mounting structure including: a bottom plate formed from an electric conductor and having the plurality of power generating elements arrayed thereat; a side wall frame made of resin, the side wall frame standing along an outer edge of the bottom plate and configured to hold the concentrating member so as to face the bottom plate; a support member being a grounded electric conductor, the support member configured to be in contact with the bottom plate to support the concentrator photovoltaic module; and a fastening member configured to fasten the support member and the bottom plate to each other thereby to fix the concentrator photovoltaic module to the support member, the fastening member being formed from an electric conductor thereby to serve as a path for electric connection from the bottom plate to the support member.

A concentrator photovoltaic module according to one embodiment uses the mounting structure for the concentrator photovoltaic module housing.

A concentrator photovoltaic panel according to one embodiment is formed by arranging a plurality of the concentrator photovoltaic modules.

A concentrator photovoltaic apparatus according to one embodiment includes: the concentrator photovoltaic panel; and a driving device configured to drive the concentrator photovoltaic panel to track movement of the sun while the concentrator photovoltaic panel is oriented toward a direction of the sun.

DESCRIPTION OF EMBODIMENTS

Technical Problem

Inside a concentrator photovoltaic module, due to series connection of a large number of power generating elements, high voltage is generated. Thus, for safety, the bottom plate (metal) located immediately below electric circuitry needs to be grounded. If the entirety of the housing is made of metal, it is easy to establish grounding from any part of the housing, but if the frame body other than the bottom plate is made of resin, it is not easy to establish grounding compared with a case where the entirety of the housing is made of metal.

Figure 9:
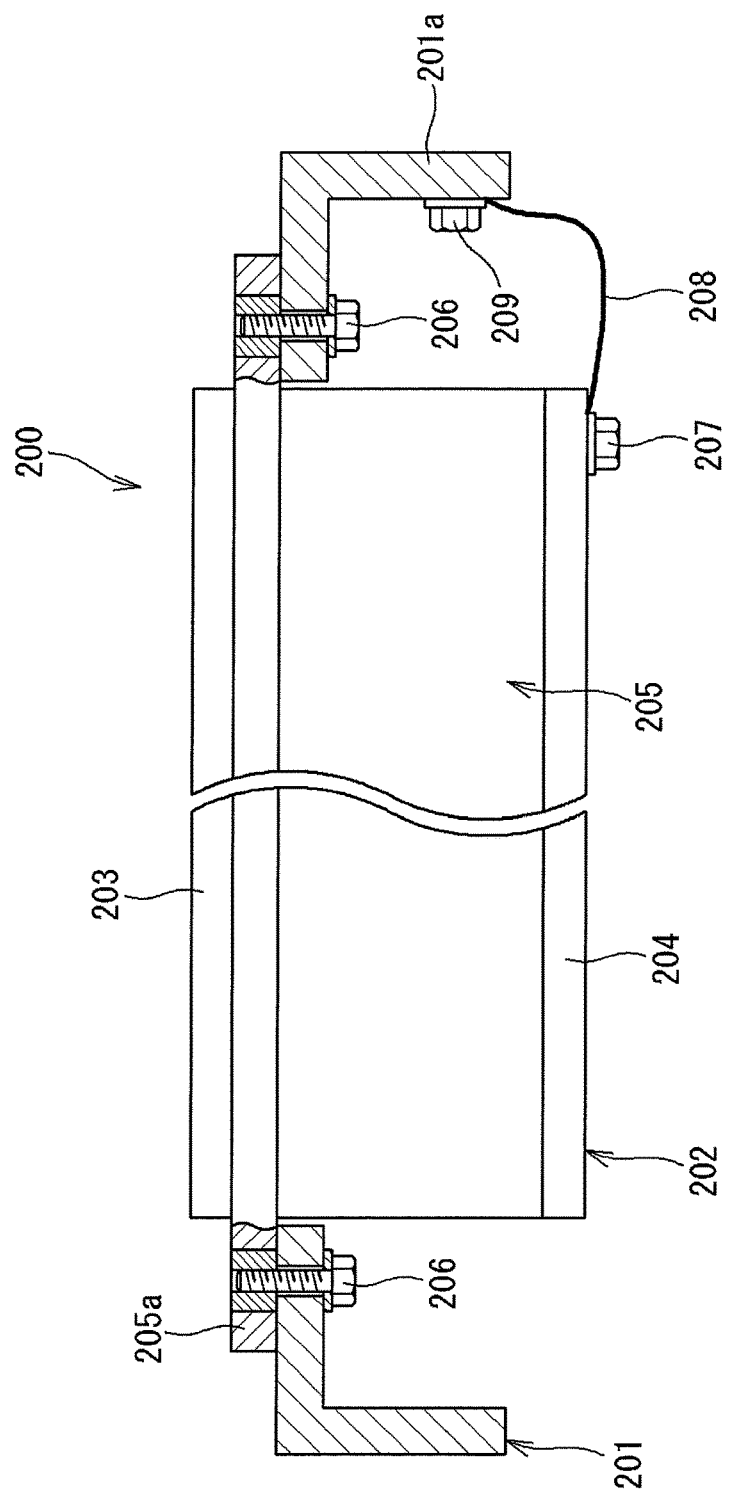
FIG. 9 is a diagram showing one example of a structure in which a module using a housing of which frame body is formed from resin and of which bottom plate is formed from an electric conductor is mounted to a pedestal of a photovoltaic apparatus.

FIG. 9 is a diagram showing one example of a structure in which a module using a housing of which frame body is formed from resin and of which bottom plate is formed from an electric conductor is mounted to a pedestal of a photovoltaic apparatus.

In FIG. 9, a concentrator photovoltaic module 200 is fixed to a pedestal 201 of the photovoltaic apparatus. The concentrator photovoltaic module 200 includes: a housing 202; and a concentrating portion 203 configured to cover the opening of the housing 202.

The housing 202 includes: a bottom plate 204 formed from an electric conductor and having power generating elements (not shown) arrayed therein; and a frame body 205 formed from resin.

A flange portion 205a protruding from the outer face of the frame body 205 and the pedestal 201 are fastened together by means of bolts 206, whereby the concentrator photovoltaic module 200 of this example is fixed to the pedestal 201.

A bolt 207 is attached to the outer face of the bottom plate 204. The bolt 207 fixes a conductor line 208 to the bottom plate 204.

One end portion of the conductor line 208 is sandwiched by the bolt 207 and the bottom plate 204. The other end portion of the conductor line 208 is sandwiched by a bolt 209 mounted to a side plate portion 201a of the pedestal 201 and the side plate portion 201a.

The conductor line 208 electrically connects the bottom plate 204 and the pedestal 201 to each other. The pedestal 201 is connected to another member having conductivity, and the bottom plate 204 is grounded through the conductor line 208 and the pedestal 201.

As described above, in a case where the frame body of the housing is formed from resin, it is conceivable that the bottom plate is formed from an electric conductor, and the bottom plate and a conductor outside the housing are electrically connected to each other by a conductor line.

In a case where the module 200 having the above configuration is fixed to a photovoltaic apparatus, after the module 200 is fixed to the pedestal 201 by means of the bolts 206, the work of connecting the conductor line 208 needs to be performed, and this results in complicated work. Further, in some cases, a large number of the modules 200 are fixed to the pedestal 201, and such complicated work is repeated many times, and consequently, a large number of man-hours are required.

Thus, there are demands for measures that facilitate the work of fixing the module 200 to the photovoltaic apparatus.

The present invention has been made in consideration of these circumstances, and an object of the present invention is to provide a mounting structure for a concentrator photovoltaic module housing, a concentrator photovoltaic module, a concentrator photovoltaic panel, and a concentrator photovoltaic apparatus which are capable of facilitating work of fixing the concentrator photovoltaic module to a power generation apparatus.

Advantageous Effects of the Present Disclosure

According to the present disclosure, work of fixing a concentrator photovoltaic module to a power generation apparatus is facilitated while grounding of the concentrator photovoltaic module is ensured.

DESCRIPTION OF EMBODIMENTS

First, the contents of embodiments of the present invention are listed and described.

(1) A mounting structure for a concentrator photovoltaic module housing as one embodiment is a mounting structure for a concentrator photovoltaic module housing configured to be used in a concentrator photovoltaic module, the concentrator photovoltaic module including: a plurality of power generating elements; and a concentrating member configured to concentrate sunlight toward each of the plurality of power generating elements, the mounting structure including: a bottom plate formed from an electric conductor and having the plurality of power generating elements arrayed thereat; a side wall frame made of resin, the side wall frame standing along an outer edge of the bottom plate and configured to hold the concentrating member so as to face the bottom plate; a support member being a grounded electric conductor, the support member configured to be in contact with the bottom plate to support the concentrator photovoltaic module; and a fastening member configured to fasten the support member and the bottom plate to each other thereby to fix the concentrator photovoltaic module to the support member, the fastening member being formed from an electric conductor thereby to serve as a path for electric connection from the bottom plate to the support member.

According to the mounting structure for the concentrator photovoltaic module housing having the above configuration, if the concentrator photovoltaic module is fixed to the support member by means of the fastening member, the fastening member serves as the path for electric connection from the bottom plate to the support member at the same time, whereby grounding of the bottom plate can be ensured.

Thus, different from the conventional example mentioned above, after fixing a module, it is not necessary to further perform work of connecting a conductor line for providing grounding. Therefore, work of fixing the concentrator photovoltaic module to the power generation apparatus can be facilitated.

(2) Preferably, in the mounting structure for the concentrator photovoltaic module housing, the fastening member includes: a bolt configured to penetrate the bottom plate and the support member; and a nut configured to be screwed with the bolt to fasten the bottom plate and the support member.

In this case, the bottom plate and the support member can be easily fixed.

(3) In the mounting structure for the concentrator photovoltaic module housing, a holding portion holding the nut or a head of the bolt inside the housing and at an inner face of the bottom plate may be formed integrally with an inner face of the side wall frame.

In a case where the holding portion holds the nut, the bolt can be inserted from outside of the housing, and the bolt can be screwed into the nut held inside the housing. Accordingly, the bottom plate and the support member can be further easily fixed. In a case where the holding portion holds the head of the bolt, if the nut is screwed onto the bolt held in the holding portion and protruding to the outside of the housing, the bottom plate and the support member can be fixed.

Moreover, since the holding portion is formed integrally with the side wall frame, the holding portion can be provided at a low cost and a high accuracy.

(4) Further, the nut or the head of the bolt may be molded and held in the holding portion. In this case, the nut or the head of the bolt can be reliably held.

(5) The nut or the head of the bolt may be inserted and held in the holding portion. In this case, the nut or the head of the bolt can be easily and reliably held in the holding portion.

(6) Preferably, in the mounting structure for the concentrator photovoltaic module housing, a seal layer for sealing inside of the concentrator photovoltaic module is formed between the holding portion and the inner face of the bottom plate.

In this case, it is possible to prevent foreign matter such as water and dust from entering the inside of the housing through the gap present between the bottom plate and the bolt penetrating the bottom plate.

(7) A concentrator photovoltaic module as one embodiment uses the concentrator photovoltaic module housing according to (1) above.

(8) A concentrator photovoltaic panel as one embodiment is formed by arranging a plurality of the concentrator photovoltaic modules according to (7) above.

(9) A concentrator photovoltaic apparatus as one embodiment includes: the concentrator photovoltaic panel according to (8) above; and a driving device configured to drive the concentrator photovoltaic panel to track movement of the sun while the concentrator photovoltaic panel is oriented toward a direction of the sun.

According to the concentrator photovoltaic module, the concentrator photovoltaic panel, and the concentrator photovoltaic apparatus that have the configurations described above, work of fixing the concentrator photovoltaic module to the power generation apparatus can be facilitated.

Details of Embodiments

Hereinafter, preferable embodiments are described with reference to the drawings.

It should be noted that at least a part of embodiments described below may be combined as desired.

[Concentrator Photovoltaic Apparatus and Concentrator Photovoltaic Panel]

First, a configuration of a concentrator photovoltaic apparatus is described.

Figure 1:
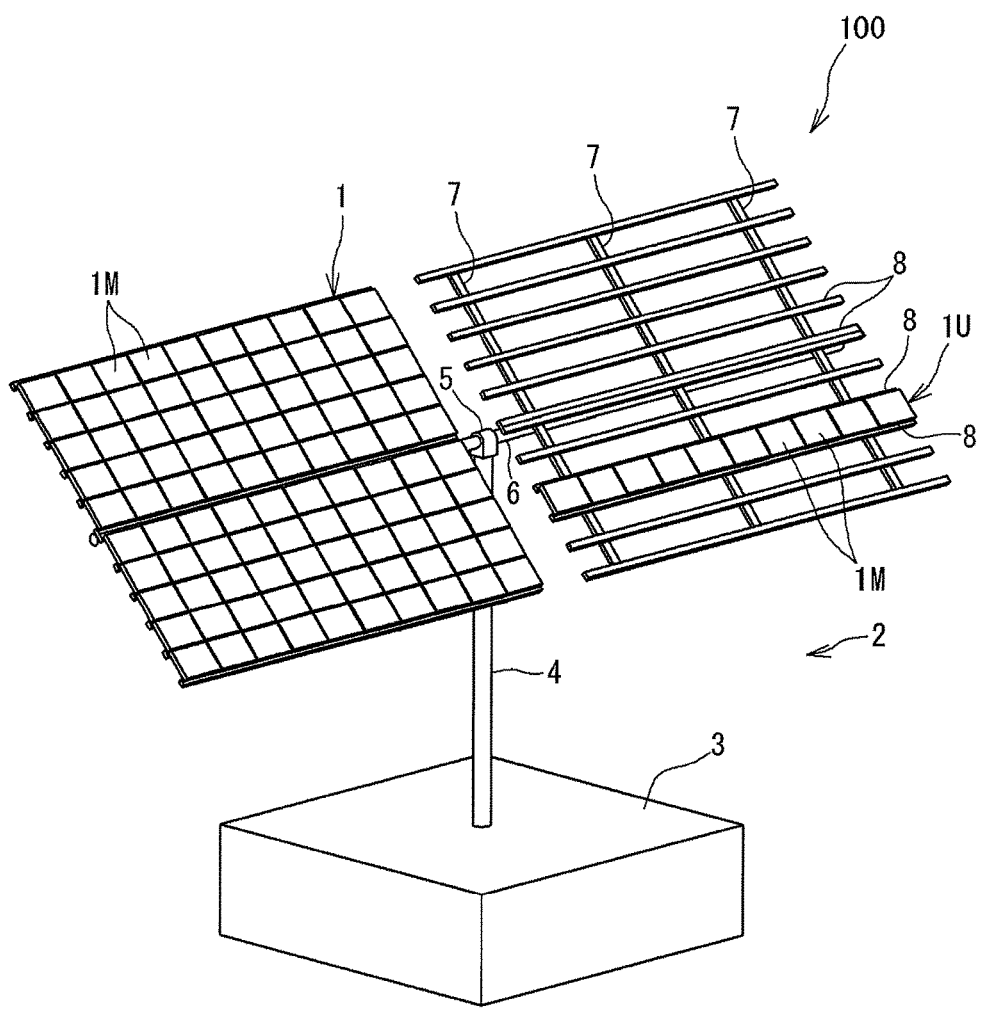
FIG. 1 is a perspective view showing one example of a concentrator photovoltaic apparatus.

FIG. 1 is a perspective view showing one example of a concentrator photovoltaic apparatus.

In FIG. 1, a photovoltaic apparatus 100 includes: a photovoltaic panel 1 composed of two panels, i.e., left wing and right wing; and a pedestal 2 which supports the photovoltaic panel 1 at the rear face side thereof.

In FIG. 1, with respect to the panel 1 at the right on the drawing sheet, a part of the photovoltaic panel 1 is omitted in order to show the structure of the pedestal 2.

The pedestal 2 includes: a base 3 and a support portion 4 standing on the base 3. The base 3 is fixed to the ground. The support portion 4 is vertically provided. A driving device 5 is provided at the support point for the photovoltaic panel 1, the support point being at the upper end of the support portion 4. The driving device 5 drives the photovoltaic panel 1 so as to rotate in the elevation direction, about a horizontally extending shaft 6. In addition, the driving device 5 drives the photovoltaic panel 1 so as to rotate in the azimuth direction, about the support portion 4.

The driving device 5 is controlled by a control device (not shown). The control device has a drive circuit for driving built-in motors of the driving device 5. Through the operation of the motor (stepping motor) for each axis, the photovoltaic panel 1 can take an attitude at any angle for each of the azimuth and the elevation.

The shaft 6, which is driven by the driving device 5, is provided with a plurality of beams 7 in a direction perpendicular to the shaft 6.

The photovoltaic panel 1 is fixed to the upper side of the plurality of beams 7.

The photovoltaic panel 1 is formed by arraying, in multiple rows, units 1U each formed by arranging 10 photovoltaic modules 1M horizontally in a row, for example.

Each unit 1U includes: a plurality of the photovoltaic modules 1M; and a pair of frames 8 which integrally fix these photovoltaic modules 1M in a state of being aligned in a line.

Each unit 1U is extended over the beams 7 and is fixed to the upper side of the beams 7.

Each wing of the photovoltaic panel 1 is composed of 10 units 1U, for example. Accordingly, each wing of the photovoltaic panel 1 is formed by arranging 10 (in length)× 10 (in breadth) photovoltaic modules 1M in a matrix shape. Accordingly, 200 photovoltaic modules 1M are present in the photovoltaic panel 1 having the two wings.

Figure 2:
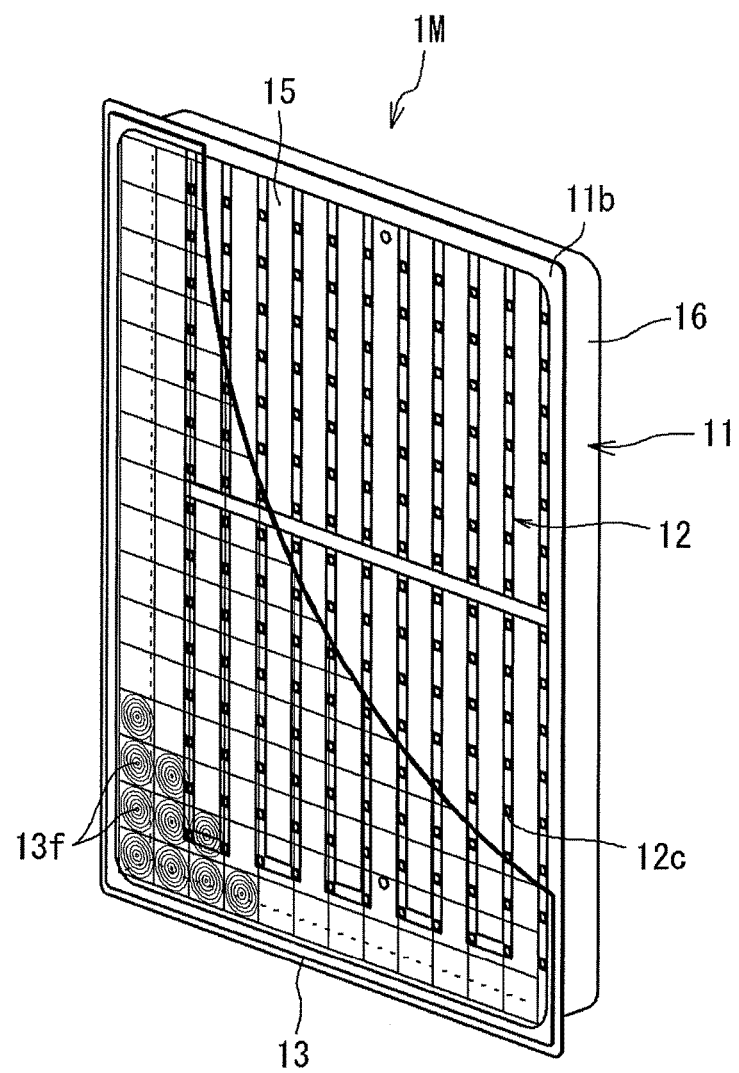
FIG. 2 is an enlarged perspective view (partially cut out) showing one example of a concentrator photovoltaic module.

FIG. 2 is an enlarged perspective view (partially cut out) showing one example of a concentrator photovoltaic module (hereinafter, also simply referred to as module) 1M. In FIG. 2, the module 1M includes as major components: a housing 11 in a box shape; a flexible printed circuit 12 arranged in a plurality of rows at a bottom plate 15 of the housing 11; and a concentrating portion 13 mounted, like a cover, to a flange portion 11b of the housing 11.

The flexible printed circuit 12 is obtained by providing a strip-film-shaped insulating base material with an electric conductor layer forming a circuit pattern. On top of this, cells 12c as power generating elements and other electronic components are mounted. As each cell 12c, a solar battery having heat resistance and a high power generation efficiency is used.

The housing 11 includes: the bottom plate 15 where the flexible printed circuit 12 is disposed; and a side wall frame 16 standing along the outer edge of the bottom plate 15 and holding the concentrating portion 13 so as to face the bottom plate 15. The housing 11 will be described later in detail.

The concentrating portion 13 is a Fresnel lens array and is formed by arranging, in a matrix shape, a plurality of (for example, 16 in length×12 in breadth, 192 in total) Fresnel lenses 13f which each concentrates sunlight. The concentrating portion 13 can be obtained by, for example, forming a silicone resin film at a back surface (inside) of a glass plate as a base material. Each Fresnel lens 13f is formed at this resin film. The total number and arrangement of the Fresnel lenses 13f are the same as the total number and arrangement of the cells 12c, and the Fresnel lenses 13f and the cells 12c are in one-to-one correspondence with each other so that their optical axes are aligned with each other.

Figure 3:
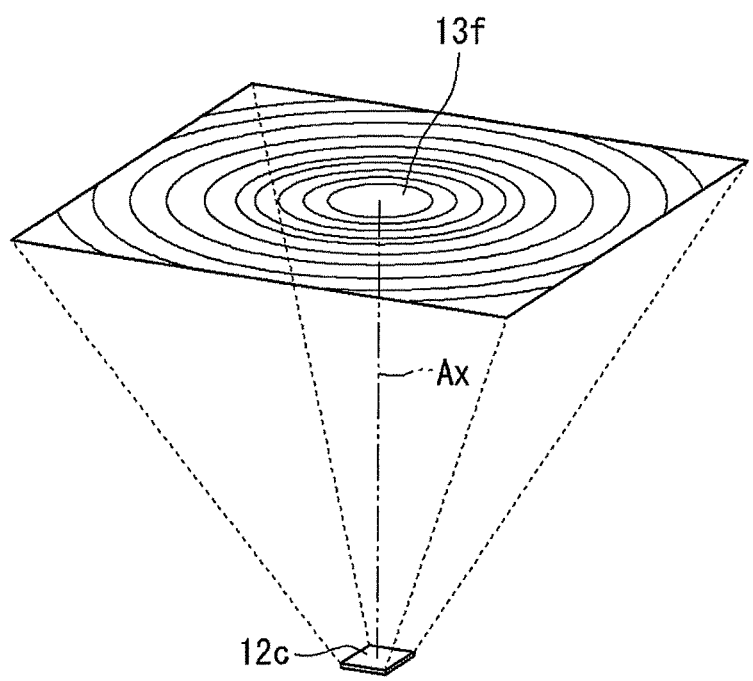
FIG. 3 is a perspective view showing optical relationship between one Fresnel lens and one cell.

FIG. 3 is a perspective view showing optical relationship between one Fresnel lens 13f and one cell 12c. The optical axis Ax of Fresnel lens 13f passes through the center of the cell 12c. When sunlight is incident on the Fresnel lens 13f at an incidence angle of 0 degrees, light having been converged by the Fresnel lens 13f is concentrated at the cell 12c and the cell 12c generates power. During the daytime, if the photovoltaic panel 1 (FIG. 1) accurately tracks the sun, such optical relationship is always established, whereby power generation is efficiently performed.

[Mounting Structure for Housing]

Figure 4:
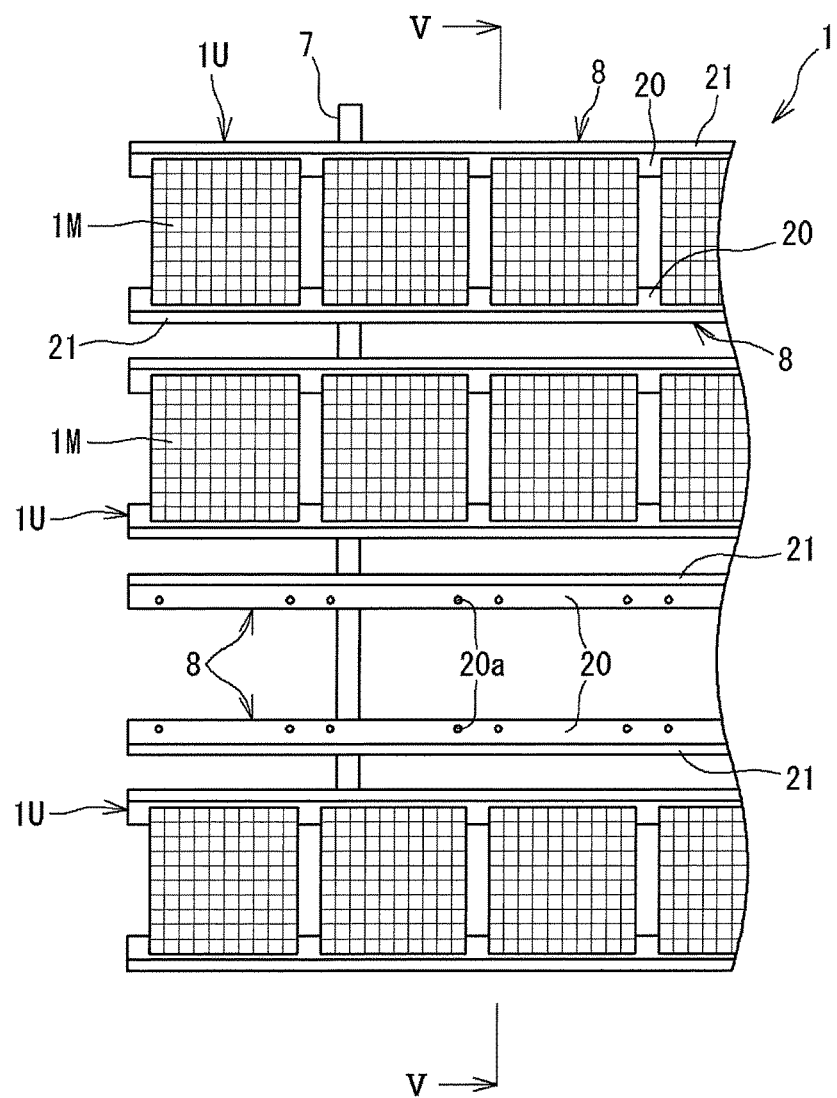
FIG. 4 is a partial top view of the photovoltaic panel shown in FIG. 1.

FIG. 4 is a partial top view of the photovoltaic panel 1 shown in FIG. 1.

As described above, a plurality of the units 1U forming the photovoltaic panel 1 each include: a plurality of the modules 1M; and a pair of the frames 8 integrally fixing the plurality of the modules 1M in a state of being aligned in a line.

Each of the pair of the frames 8 is a long member extending in the horizontal direction, and is formed from an electric conductor such as a structure steel, an aluminium alloy, or the like.

The modules 1M are arranged in a line at a predetermined interval, between the pair of the frames 8, and are fixed to the pair of the frames 8.

The length and breadth dimensions and the shape of the module 1M do not reflect those shown in FIG. 2, and are expressed in a simplified manner as one example.

The modules 1M are fixed to the pair of the frames 8, thereby forming a unit 1U.

Each unit 1U is provided so as to be extended over the beams 7 such that the longitudinal direction of the unit 1U is parallel to the horizontal direction, and the unit 1U is fixed to the beams 7. Each unit 1U is fixed to the beams 7, by the frames 8 and the beams 7 are fixed to each other.

In this manner, each module 1M is supported and fixed by the frames 8 fixed to the beams 7, and the pair of the frames 8 form a support member which supports the modules 1M.

Figure 5:
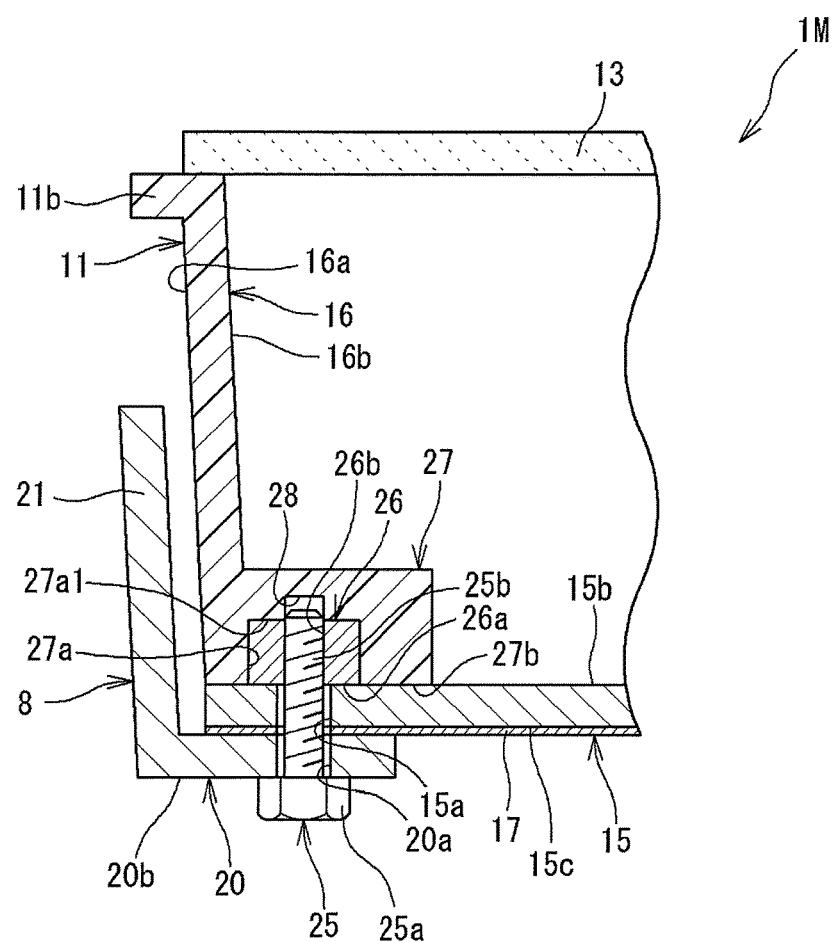
FIG. 5 is a cross-sectional view showing a main part on a line V-V in FIG. 4.

FIG. 5 is a cross-sectional view showing a main part on a line V-V in FIG. 4.

With reference to FIG. 4 and FIG. 5, the frame 8 is a member having an L-shape in cross-section. The frame 8 includes: a bottom portion 20 being in contact with the bottom plate 15 of the module 1M; and a side plate portion 21 standing along the outer edge of the bottom portion 20.

The side plate portion 21 is formed so as to extend along an outer face 16a of the side wall frame 16 of the module 1M disposed between the pair of the frames 8.

The side plate portion 21 is formed such that an appropriate gap is provided between the side plate portion 21 and the outer face 16a. The side plate portion 21 has a function as a guide that aligns the modules 1M in the longitudinal direction of the frames 8 when the modules 1M are fixed to the frames 8.

The bottom portion 20 of each of the pair of the frames 8 is in contact with the bottom plate 15, thereby supporting the modules 1M.

Thus, the pair of the frames 8 support the modules 1M while aligning the modules 1M in the longitudinal direction of the frame 8.

In the housing 11 of the module 1M, the bottom plate 15 is formed from an aluminium alloy which is an electric conductor, and the side wall frame 16 is formed from resin, for example.

Thus, with respect to the housing 11 of the present embodiment, the bottom plate 15 and the side wall frame 16 are formed as separate members, and the housing 11 is assembled by the bottom plate 15 and the side wall frame 16 being fixed to each other.

The side wall frame 16 is formed in a rectangular frame shape by use of PBT (Poly Butylene Terephtalate) resin loaded with glass fibers, for example. The concentrating portion 13 is fixed to the opening at the one-side end face of the side wall frame 16. The bottom plate 15 is fixed to the side wall frame 16 so as to close the opening at the other-side end face of the side wall frame 16.

The bottom plate 15 and the side wall frame 16 are bonded and fixed by use of a sealing agent having a bonding effect, whereby water and dust are prevented from entering the housing 11 through the joining portion between the bottom plate 15 and the side wall frame 16.

In addition, a rust prevention film 17 is formed at an outer face 15c of the bottom plate 15 as a result of rust prevention treatment being performed thereon.

The housing 11 includes a bolt 25 and a nut 26 for fastening the bottom portion 20 and the bottom plate 15.

Each module 1M is fixed to the frames 8 as a result of the bottom portion 20 and the bottom plate 15 being fastened by the bolt 25 and the nut 26.

The bolt 25 and the nut 26 are a general bolt and a general nut each formed from an electric conductor such as machine structure steel or stainless steel, for example. The bolt 25 and the nut 26 are mounted at each of four corners of the bottom plate 15.

Each bolt 25 penetrates the bottom plate 15 and the bottom portion 20b being in contact with each other, and is screwed into the corresponding nut 26 disposed inside the housing 11. The bolt 25 is screwed into the nut 26, and tightens the bottom plate 15 and the bottom portion 20 between the bolt 25 and the nut 26, thereby fastening the bottom plate 15 and the bottom portion 20.

A hole portion 15a to be penetrated by the bolt 25 is formed in the bottom plate 15 of the module 1M.

The hole portion 15a in the bottom plate 15 is formed at each of four corners of the housing 11 so as to allow communication between the inside and the outside of the housing 11.

A hole portion 20a to be penetrated by the bolt 25 is also formed in the bottom portion 20 of each frame 8.

The hole portion 20a in the bottom portion 20 is formed at a position that corresponds to each hole portion 15a when the module 1M is fixed to the frames 8. Thus, as shown in FIG. 4, the hole portions 20a are formed at predetermined positions in the bottom portion 20 along the longitudinal direction of the frame 8.

The bolt 25 is inserted in the hole portion 20a and the hole portion 15a from the bottom portion 20 side of the frame 8, penetrates the bottom portion 20 and the bottom plate 15, and is screwed into the nut 26.

The nut 26 is held at an inner face 15b of the bottom plate 15 inside the housing 11, by a holding portion 27 protruding from an inner face 16b of the side wall frame 16.

Figure 6:
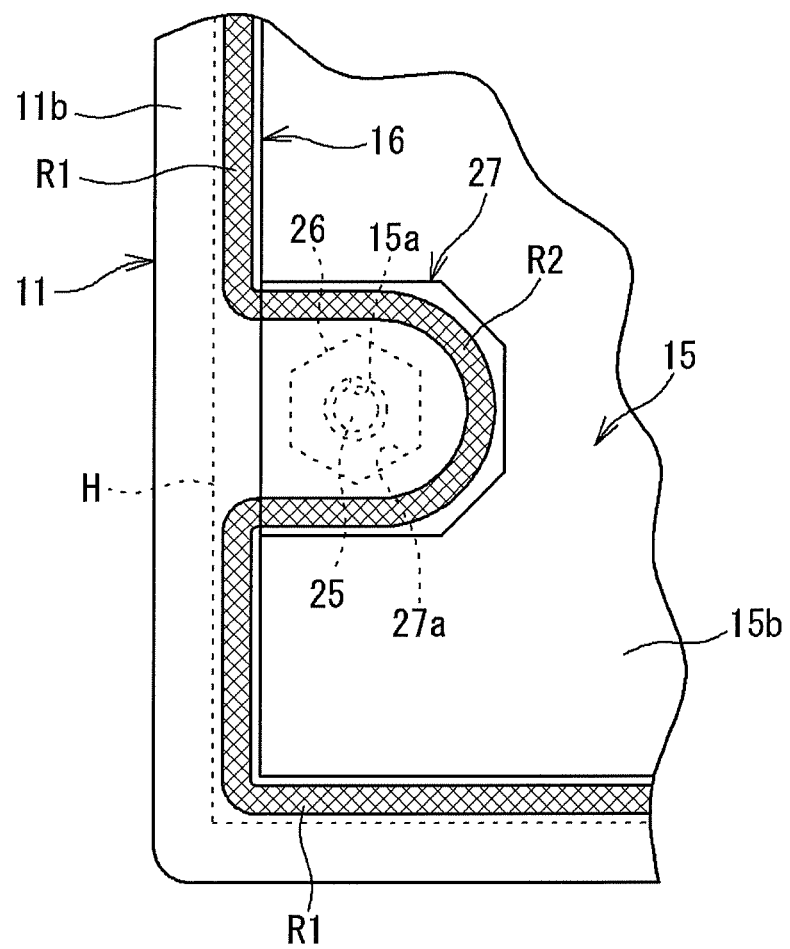
FIG. 6 is a diagram of a holding portion shown in FIG. 5, viewed from above.

FIG. 6 is a diagram of the holding portion 27 in FIG. 5, viewed from above. In FIG. 6, the concentrating portion 13 is not shown.

As shown in FIG. 5 and FIG. 6, the holding portion 27 is formed integrally with the side wall frame 16, and is provided at each of four corners in the housing 11, so as to correspond to each hole portion 15a in the bottom plate 15.

Each holding portion 27 is provided so as to protrude from the side wall frame 16 along the bottom plate 15. A holding hole 27a for accommodating the nut 26 is formed in the holding portion 27. The holding portion 27 holds the nut 26, with the nut 26 being accommodated in the holding hole 27a.

The holding hole 27a is open at the bottom plate 15 side, and is formed in a hexagonal hole shape in cross-section so as to correspond to the outer shape of the nut 26. The dimensions in cross-section of the holding hole 27a is set to values slightly smaller than the dimensions of the outer shape of the nut 26 such that the holding hole 27a can hold the nut 26 pressed therein.

Thus, the nut 26 is pressed (inserted) in the holding hole 27a and held therein. Since the holding hole 27a is formed in a hexagonal hole shape in cross-section, the nut 26 is held in a state where relative rotation of the nut 26 with respect to the bottom plate 15 is restricted.

The depth dimension of the holding hole 27a is substantially the same as the thickness dimension of the nut 26. Thus, when the nut 26 is pressed in until coming into contact with a bottom face 27a1 of the holding hole 27a, one end face 26a of the nut 26 and a lower face 27b of the holding portion 27 are substantially flush with each other.

A clearance portion 28 which is a space for receiving a shank 25b of the bolt 25 is formed in the bottom face 27a1 of the holding hole 27a. Accordingly, even if the shank 25b of the bolt 25 screwed in the nut 26 protrudes from the nut 26, the protruding portion of the shank 25b can be received in the clearance portion 28.

The holding portion 27 is bonded and fixed to the inner face 15b of the bottom plate 15 by means of the sealing agent bonding the bottom plate 15 and the side wall frame 16 together.

A region R1 and a region R2 indicated by cross-hatching in FIG. 6 represent regions where the sealing agent is applied between the bottom plate 15 and the side wall frame 16 including the holding portion 27.

In FIG. 6, a broken line H shows the edge of the bottom plate 15. The region R1 is a region where the sealing agent is applied, in a region where the end face of the side wall frame 16 and the bottom plate 15 are in contact with each other. By the sealing agent being applied to the region R1, the bottom plate 15 and the side wall frame 16 are bonded and fixed together.

The region R2 is a region where the sealing agent is applied, between the lower face 27b of the holding portion 27 and the bottom plate 15.

The region R2 has both ends thereof connected to the region R1, and surrounds the hole portion 15a having the bolt 25 inserted therein, along the periphery of the holding portion 27. In this manner, at the lower face 27b of the holding portion 27, the sealing agent is applied so as to isolate the hole portion 15a from the inside of the housing 11.

Figure 7:
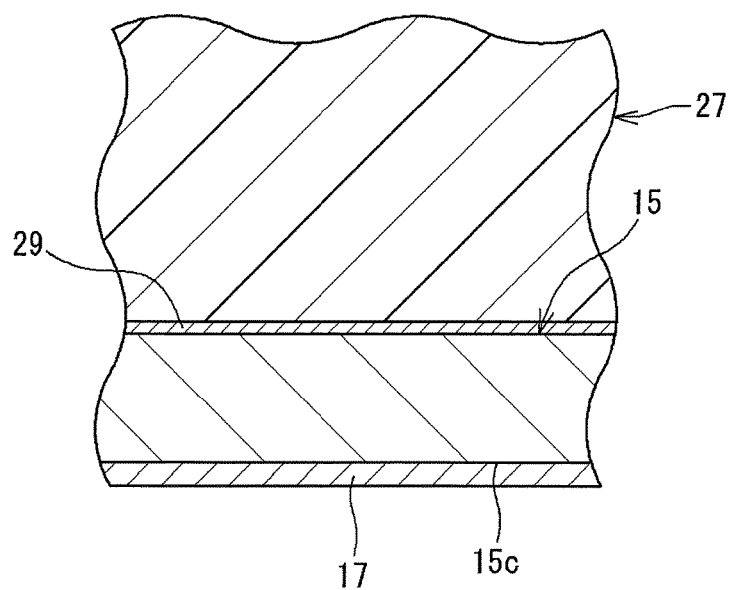
FIG. 7 is an enlarged view of a portion where a sealing agent is applied between the holding portion and a bottom plate in FIG. 5.

FIG. 7 is an enlarged view of a portion where the sealing agent is applied between the holding portion 27 and the bottom plate 15 in FIG. 5.

As shown in FIG. 7, in the portion where the sealing agent is applied between the holding portion 27 and the bottom plate 15, a seal layer 29 formed by the applied sealing agent is present. The seal layer 29 bonds and fixes the holding portion 27 and the bottom plate 15 together, and closes the gap between the holding portion 27 and the bottom plate 15, thereby sealing the inside of the housing 11 from the outside.

Accordingly, water and dust are prevented from entering the inside of the housing 11 through the hole portion 15a in which the bolt 25 is inserted.

In FIG. 7, the portion where the sealing agent is applied between the holding portion 27 and the bottom plate 15 is shown. However, also in the portion between the side wall frame 16 and the bottom plate 15 where the sealing agent is applied and where the side wall frame 16 and the bottom plate 15 are bonded and fixed by the sealing agent, a seal layer formed by the sealing agent is present.

This seal layer seals the joining portion between the bottom plate 15 and the side wall frame 16, and prevents water and dust from entering the inside of the housing 11 through the joining portion.

With reference to FIG. 5 and FIG. 6, the bolt 25 is screwed into the nut 26 held inside the housing 11 as described above. As a result of the bolt 25 being screwed into the nut 26, the bolt 25 and the nut 26 tighten the bottom plate 15 and the bottom portion 20 between a head 25a and the nut 26, thereby fastening the bottom plate 15 and the bottom portion 20.

At this time, the head 25a of the bolt 25 is in contact with a lower face 20b of the bottom portion 20 of the frame 8, and the nut 26 is in contact with the inner face 15b of the bottom plate 15.

As described above, the bolt 25 and the nut 26 are each formed from an electric conductor. In addition, the frame 8 and the bottom plate 15 are each formed from an electric conductor.

Here, the frame 8 formed from an electric conductor is electrically connected to a ground line (not shown) of the photovoltaic apparatus 100.

The bottom plate 15 is also formed from an electric conductor.

Thus, by being in contact with the frame 8 and the bottom plate 15, the bolt 25 and the nut 26 electrically connect the frame 8 and the bottom plate 15 to each other. Accordingly, the bottom plate 15 is connected to the ground line of the photovoltaic apparatus 100, through the nut 26, the bolt 25, and the frame 8.

Since the rust prevention film 17 is formed at the outer face 15c of the bottom plate 15, even when the bottom portion 20 of the frame 8 and the outer face 15c of the bottom plate 15 abut each other, there are cases where electric current is difficult to flow due to the presence of the rust prevention film 17.

In this regard, in the present embodiment, since the frame 8 and the bottom plate 15 are electrically connected by means of the bolt 25 and the nut 26, even in a state where the rust prevention film 17 is interposed between the bottom portion 20 and the bottom plate 15, continuity can be sufficiently ensured.

In this manner, since the bolt 25 and the nut 26 of the present embodiment are each an electric conductor, the bolt 25 and the nut 26 serve as a path for electric connection from the bottom plate 15 to the frame 8. Accordingly, grounding necessary for the concentrator photovoltaic module 1M is ensured. At this time, the resistance-to-ground of the bottom plate 15 is set to $0.1\Omega$ or lower.

In a case where the module 1M having the above configuration is fixed to a pair of the frames 8, the fixing is performed in the following procedure.

First, the module 1M is disposed between a pair of the frames 8, and the hole portion 15a formed at each of four corners of the bottom plate 15 of the module 1M and the corresponding hole portion 20a formed in the bottom portion 20 of the corresponding frame 8 are aligned to each other. At this time, the bolt 25 is not yet screwed into the nut 26.

Next, the bolt 25 is inserted into the hole portion 20a and the hole portion 15a from the bottom portion 20 side of the frame 8, to be screwed into the nut 26 held inside the housing 11.

At this time, the nut 26 is held by the holding portion 27, in a state where the one end face 26a is in contact with the inner face 15b of the bottom plate 15, and in a state where relative rotation of the nut 26 with respect to the bottom plate 15 is restricted at a position where a female screw portion 26b of the nut 26 is aligned with the hole portion 15a.

Thus, if the module 1M is disposed at the pair of the frames 8, and the hole portion 20a in the bottom portion 20 and the hole portion 15a in the bottom plate 15 are aligned to each other, it is possible to easily screw the bolt 25 into the nut 26, without requiring work of positioning the nut 26 or preventing the nut 26 from rotating together with the bolt 25.

Accordingly, work at the time of fixing the module 1M to the pair of the frames 8 is facilitated.

Next, the bolt 25 is screwed into the nut 26 inside the housing 11, and the bottom plate 15 and the bottom portion 20 are tightened under a predetermined torque between the head 25a and the nut 26, whereby the bottom plate 15 and the bottom portion 20 are fastened.

Accordingly, the head 25a of the bolt 25 can be made into contact with the bottom portion 20 of the frame 8, and further, the nut 26 can be made into contact with the bottom plate 15.

Therefore, if the bottom plate 15 and the bottom portion 20 are fastened, the bottom plate 15 and the frame 8 can be electrically connected to each other.

When the fastening of the bottom plate 15 and the bottom portion 20 by means of the bolt 25 and the nut 26 has been performed at four places for each module 1M, the fixing of the module 1M to the pair of the frames 8 ends.

A mounting structure for the housing 11 of the module 1M according to the above embodiment includes: the bottom plate 15 formed from an electric conductor and having a plurality of cells 12c (power generating elements) arrayed thereat; the side wall frame 16 made of resin, the side wall frame 16 standing along the outer edge of the bottom plate 15 and configured to hold the concentrating portion 13 so as to face the bottom plate 15; a pair of the frames 8 (support member) each being a grounded electric conductor, and each being in contact with the bottom plate 15 to support the module 1M; and the bolts 25 and the nuts 26, as a fastening member, configured to fasten the pair of the frames 8 and the bottom plate 15 to each other thereby to fix the module 1M to the pair of the frames 8, the bolts 25 and the nuts 26 each being an electric conductor thereby to serve as paths for electric connection from the bottom plate 15 to the pair of the frames 8.

According to the housing 11 having the above configuration, each bolt 25 and each nut 26 which fix the module 1M to the pair of the frames 8 serve as the paths for electric connection from the bottom plate 15 to the frames 8, and thus, if the module 1M is fixed to the pair of the frames 8 by means of the bolt 25 and the nut 26, grounding of the bottom plate 15 can be ensured at the same time.

Thus, different from the conventional example mentioned above, after fixing a module, it is not necessary to further perform work of connecting a conductor line for providing grounding. Therefore, work of fixing a module 1M to the power generation apparatus 100 can be facilitated.

In the housing 11 described above, as the fastening member which fastens the pair of the frames 8 and the bottom plate 15 thereby to fix the module 1M to the pair of the frames 8, the bolts 25 penetrating the bottom plate 15 and the frames 8, and the nuts 26 screwed with the bolts 25 thereby to fasten the bottom plate 15 and the frames 8 are used. Thus, the bottom plate 15 and the pair of the frames 8 can be easily fixed to each other.

The bottom plate 15 of the housing 11 can be formed from a plate member made of an aluminium alloy. That is, if the hole portion 15a into which the bolt 25 is inserted is formed in a plate member made of an aluminium alloy, the plate member can be used as the bottom plate 15. Thus, the bottom plate 15 can be formed at a low cost.

In the housing 11 described above, the holding portion 27 holding the nut 26 inside the housing 11 and at the inner face 15b of the bottom plate 15 protrudes from the inner face 16b of the side wall frame 16. Thus, the bolt 25 can be inserted from outside of the housing 11, and the bolt 25 can be screwed into the nut 26 held inside the housing 11. Accordingly, when the bolt 25 is to be screwed into the nut 26, it is not necessary to position the nut 26 or prevent the nut 26 from rotating together with the bolt 25. Thus, the bolt 25 can be easily screwed into the nut 26. As a result, the bottom plate 15 and the pair of the frames 8 can be further easily fixed to each other.

Moreover, since the holding portion 27 is formed integrally with the side wall frame 16, the holding portion 27 can be provided at a low cost and at a high accuracy.

In the embodiment described above, since the nut 26 is pressed to be held in the holding hole 27a of the holding portion 27, the nut 26 can be easily and reliably held in the holding portion 27.

Other Embodiments

Figure 8:
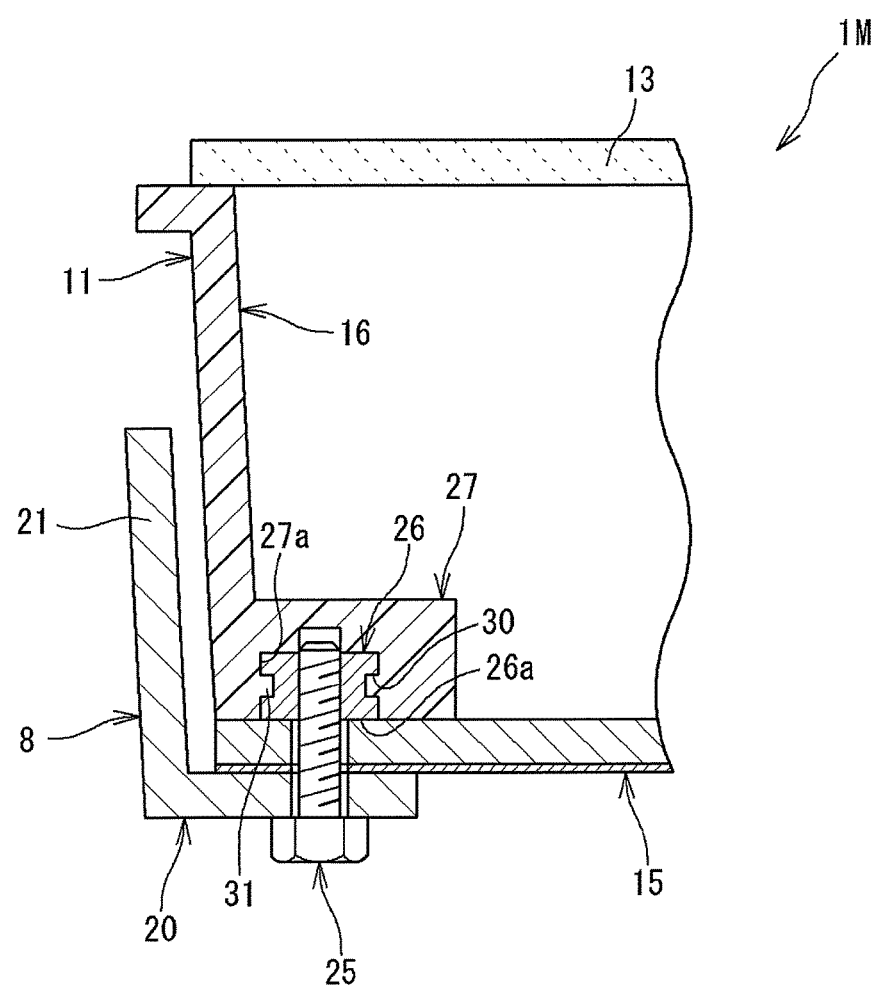
FIG. 8 is a cross-sectional view of a main part of a module according to another embodiment.

FIG. 8 is a cross-sectional view of a main part of a module according to another embodiment.

The housing 11 of the module 1M according to the present embodiment is different from the embodiment described above in that the holding portion 27 is formed with the nut 26 molded therein.

In the present embodiment, when the side wall frame 16 of the housing 11 is to be formed, the nut 26 is set in a die for forming the side wall frame 16, and is held in the holding portion 27 at the same time when the side wall frame 16 is formed.

The nut 26 of the present embodiment has a groove portion 30 formed in the side face thereof. The groove portion 30 is formed, for example, by being cut by use of a high-speed cutter or the like.

As shown in FIG. 8, resin enters the groove portion 30 during formation of the side wall frame 16, and protrudes from the inner wall of the holding hole 27a, whereby a protrusion 31 which engages with the groove portion 30 is formed.

The protrusion 31 serves as a stopper, the nut 26 is firmly held in the holding hole 27a.

As described above, the nut 26 of the present embodiment is molded and held in the holding portion 27, and thus, the nut 26 can be reliably held.

In the present embodiment, an example case in which the groove portion 30 is formed in the nut 26 has been shown. However, it is sufficient that the nut 26 is provided with a protruding portion or a recessed portion that engages with the holding portion 27 when the nut 26 is molded in the holding portion 27. For example, protrusions and recesses having a wedge shape in cross-section, a large number of holes, or the like may be formed at the surface of the nut 26. However, as in the present embodiment, a linear-shaped groove portion that can be formed by use of a cutter or the like is easy to form, and thus, such a groove portion is advantageous in reducing the cost.

In the present embodiment, a case where the groove portion 30 is formed in the nut 26 has been shown. However, if a sufficient joining force between the nut 26 and the holding portion 27 can be ensured, the nut 26 may be molded without having the groove portion 30 or the like formed therein.

[Others]

The present invention is not limited to the embodiments described above. In each embodiment described above, an example case has been shown in which: the nut 26 is held in the holding portion 27 inside the housing 11, and the bolt 25 is inserted from outside of the housing 11 to be screwed into the nut 26 inside the housing 11, whereby the frame 8 and the bottom plate 15 are fastened. However, a configuration may be employed in which: the head 2a of the bolt 25 is held in the holding portion 27 inside the housing 11, the shank 25b of the bolt 25 is caused to protrude through the hole portion 15a and the hole portion 20a to the outside of the housing 11, and then, the nut 26 is screwed onto the shank 25b of the bolt 25 from outside of the housing 11.

In the embodiments described above, a case where the rust prevention film 17 is formed at the outer face 15c of the bottom plate 15 has been shown. However, there are cases where the rust prevention film 17 is formed also at the inner face 15b, in addition to the outer face 15c of the bottom plate 15. Also in such a case, by appropriately managing the tightening torque at the time of tightening the bottom plate 15 and the bottom portion 20 by means of the bolt 25 and the nut 26, it is possible to ensure continuity between the bottom plate 15 and the nut 26 with the rust prevention film 17 interposed therebetween.

In the embodiments described above, an example case has been shown in which a general bolt and a general nut are used. However, as the nut held in the holding portion 27, an insert nut may be used instead of a general nut.

It should be noted that although such an insert nut is easy to be mounted and can be firmly held, the insert nut could become a factor that increases the cost.

In this regard, the embodiments described above in which a general nut can be reliably held are advantageous in reducing the cost compared with a case where an insert nut is used.

In each embodiment described above, an example case has been shown in which the bolt 25 and the nut 26 are used as the fastening member. However, instead of these, a rivet formed from an electric conductor may be used.

CONCLUSION

The embodiments disclosed herein are merely illustrative and not restrictive in all aspects. The scope of the present invention is defined by the scope of the claims rather than the meaning described above, and is intended to include meaning equivalent to the scope of the claims and all modifications within the scope.

REFERENCE SIGNS LIST 1 photovoltaic panel
1M photovoltaic module
1U unit
2 pedestal
3 base
4 support portion
5 driving device
6 shaft
7 beam
8 frame
11 housing
11b flange portion
12 flexible printed circuit
12c cell
13 concentrating portion
13f Fresnel lens
15 bottom plate
15a hole portion
15b inner face
15c outer face
16 side wall frame
16a outer face
16b inner face
17 rust prevention film
20 bottom portion
20a hole portion
20b lower face
21 side plate portion
25 bolt
25a head
25b shank
26 nut
26a one end face
26b female screw portion
27 holding portion
27a holding hole
27a1 bottom face
27b lower face
28 clearance portion
29 seal layer
30 groove portion
31 protrusion
100 photovoltaic apparatus

The invention claimed is:

1. A mounting structure for a concentrator photovoltaic module housing configured to be used in a concentrator photovoltaic module, the concentrator photovoltaic module including: a plurality of power generating elements; and a concentrating member configured to concentrate sunlight toward each of the plurality of power generating elements, the mounting structure comprising:
a bottom plate formed from an electric conductor and having the plurality of power generating elements arrayed thereat;
a side wall frame made of resin, the side wall frame standing along an outer edge of the bottom plate and configured to hold the concentrating member so as to face the bottom plate;
a support member being a grounded electric conductor, the support member configured to be in contact with the bottom plate to support the concentrator photovoltaic module; and
a fastening member configured to fasten the support member and the bottom plate to each other thereby to fix the concentrator photovoltaic module to the support member, the fastening member being formed from an electric conductor thereby to serve as a path for electric connection from the bottom plate to the support member, wherein
the fastening member includes:
a bolt configured to penetrate the bottom plate and the support member; and
a nut configured to be screwed with the bolt to fasten the bottom plate and the support member, wherein
a holding portion holding the nut or a head of the bolt inside the housing and at an inner face of the bottom plate is formed integrally with an inner face of the side wall frame.

2. The mounting structure for the concentrator photovoltaic module housing according to claim 1, wherein
the nut or the head of the bolt is held with the nut or the head of the bolt embedded in the holding portion.

3. The mounting structure for the concentrator photovoltaic module housing according to claim 1, wherein
the nut or the head of the bolt is inserted and held in the holding portion.

4. The mounting structure for the concentrator photovoltaic module housing according to claim 1, wherein
a seal layer for sealing inside of the concentrator photovoltaic module is formed between the holding portion and the inner face of the bottom plate.

5. A concentrator photovoltaic module using the mounting structure for the concentrator photovoltaic module housing according to claim 1.

6. A concentrator photovoltaic panel formed by arranging a plurality of the concentrator photovoltaic modules according to claim 5.

7. A concentrator photovoltaic apparatus comprising:
the concentrator photovoltaic panel according to claim 6; and
a driving device configured to drive the concentrator photovoltaic panel to track movement of the sun while the concentrator photovoltaic panel is oriented toward a direction of the sun.

* * * * *